United States Patent [19]
Dixit et al.

[11] Patent Number: 5,849,367
[45] Date of Patent: Dec. 15, 1998

[54] ELEMENTAL TITANIUM-FREE LINER AND FABRICATION PROCESS FOR INTERMETAL CONNECTIONS

[75] Inventors: Girish A. Dixit; Anthony J. Konecni, both of Plano, Tex.

[73] Assignee: Texas Instruments Incorporated, Dallas, Tex.

[21] Appl. No.: 764,674

[22] Filed: Dec. 11, 1996

[51] Int. Cl.$^6$ ..................................................... C23C 14/02
[52] U.S. Cl. ........................... 427/535; 427/99; 427/124; 427/126.1; 427/237; 427/261; 427/307; 427/331; 427/404; 427/419.7; 427/531; 427/537; 427/585
[58] Field of Search ..................................... 427/531, 535, 427/537, 585, 99, 124, 126.1, 237, 261, 307, 331, 404, 419.7

[56] References Cited

U.S. PATENT DOCUMENTS

| | | | |
|---|---|---|---|
| 5,055,425 | 10/1991 | Leibovitz et al. | 437/195 |
| 5,300,813 | 4/1994 | Joshi et al. | 257/752 |
| 5,378,660 | 1/1995 | Ngan | 437/247 |
| 5,403,779 | 4/1995 | Joshi et al. | 437/190 |
| 5,426,076 | 6/1995 | Moghadam | 437/238 |
| 5,426,330 | 6/1995 | Joshi et al. | 257/752 |
| 5,472,913 | 12/1995 | Havemann et al. | 437/195 |
| 5,565,707 | 10/1996 | Colgan et al. | 257/762 |
| 5,585,673 | 12/1996 | Joshi et al. | 257/751 |

*Primary Examiner*—Bernard Pianalto
*Attorney, Agent, or Firm*—Carlton H. Hoel; W. James Brady; Richard L. Donaldson

[57] ABSTRACT

An elemental titanium-free liner and cavity cleansing process is provided that allows for the elimination of conventional sputter etch and elemental titanium depositions. A low power plasma etch provides for pre-conditioning/cleansing of cavities such as contacts and vias. A refractory metal is provided as a cavity liner. Preferably, the liner is comprised of several discrete refractory metal liner layers, each having a thickness of about 25–100 Å, that can be applied by CVD and/or PVD. A low power plasma cleanse is preferably interposed between each liner layer deposition. A suitable metal plug can be deposited and directed into the cavity to complete cavity filling. Preferably, the metal plug is an elemental aluminum or aluminum alloy plug that is deposited by CVD and force-filled into the cavity to reduce the incidence of micro-voids within the cavity.

Elimination of the conventional sputter etch and the high temperature processing (temp.$\geq$~400° C.) associated with such processing allows for the use of polymeric dielectrics, such as the family of polytetrafluorethylene ("PTFE") compounds, which exhibit a dielectric constant ($\kappa$) of about 1.9; parylene ($\kappa$=~2.2–2.6); aerogels and xerogels ($\kappa$=~1.1–1.8); and the family of polymeric spin-on-glass ("SOG") materials; use of all the foregoing materials being attractive because of the ability of these materials to reduce parasitic capacitance of the interconnects. Because these polymeric materials are temperature sensitive, their use has been limited, as conventional device fabrication practices typically require operation temperatures far in excess of the melting and/or decomposition temperature for these materials.

6 Claims, 2 Drawing Sheets

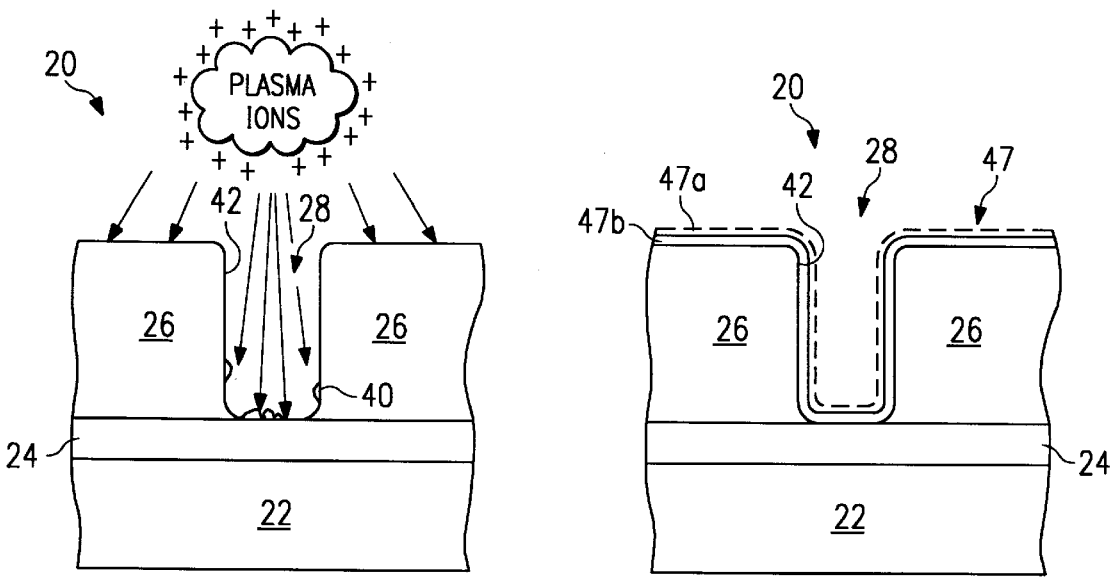
FIG. 1A
FIG. 1B
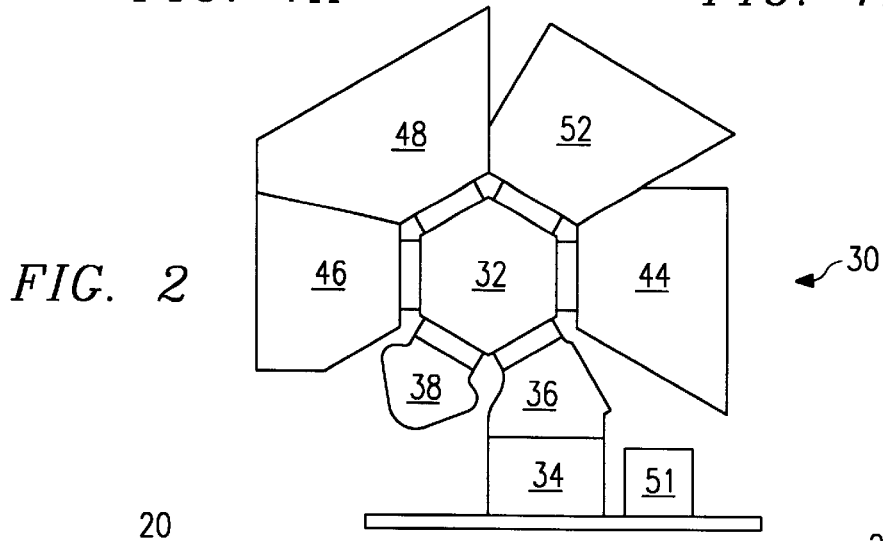
FIG. 2
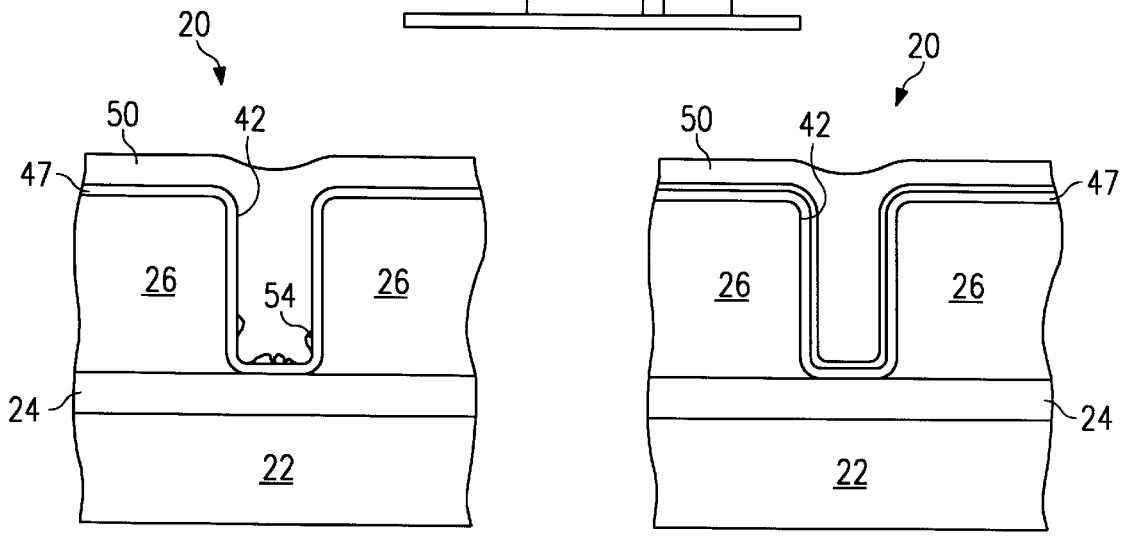
FIG. 3
(PRIOR ART)
FIG. 4

ELEMENTAL TITANIUM-FREE LINER AND FABRICATION PROCESS FOR INTER-METAL CONNECTIONS

TECHNICAL FIELD OF THE INVENTION

This invention relates to semiconductor structures and manufacturing processes, and more particularly to liner configurations and processes for filling cavities that extend between adjacent surfaces or levels of a structure so as to make electrical connections between the adjacent surfaces or levels.

BACKGROUND OF THE INVENTION

Many obstacles exist to further miniaturization of semiconductor components. Among these obstacles include the filling of metal interconnect layers to insure proper operation of the devices. Metal interconnect signal lines establish contact with adjacent conductive layers of the integrated circuit through cavities such as contacts and vias that are formed in an insulating layer. It is desirable to completely fill the cavity with a metal compatible with the metal that is used to form the interconnect layer so as to ensure optimal operation of the device.

For reasons of its cost, physical properties and availability, aluminum is presently the metal of choice for the fabrication of metal interconnect lines in integrated circuits. However, many processes still utilize tungsten (W) fill technology because of the familiarity of the technology and the availability of tungsten fill equipment. The use of tungsten fill technology is not favored, however, for current and future generations of reduced geometry (i.e., sub-0.5 $\mu$m, and especially 0.25 $\mu$m and smaller) semiconductor devices for reasons for tungsten's high electrical resistance and melting temperature. Aluminum is attractive as a fill material, as it has a much lower melting temperature and resistance than tungsten. Moreover, use of aluminum is compatible with polymeric low dielectric constant materials, most of which have melting points well below the melting point of tungsten, thereby limiting their use in tungsten-filled structures.

Present aluminum fill technology has not resulted in entirely satisfactory cavity fills, in part because of difficulties encountered in cavity pre-cleaning and filling processes. Cavities and metal interconnect lines are typically formed by a sputtering process. Problems can arise from the accumulation of relatively large amounts of aluminum at the upper surface of the insulating layer and at the edges of the contact or via. These accumulations can block or otherwise obstruct the via prior to the delivery of aluminum in sufficient quantity to completely fill the via, resulting in the formation of voids and uneven electrical signal conducting structures within the via. This problem is particularly acute as integrated circuits are fabricated using smaller geometrys.

Finer dimensioned contacts that are to be used in smaller geometry devices, such as future generations of sub-0.5 $\mu$m scaled technologies, necessarily will be provided with a larger aspect ratio (i.e., relationship of height to width) than is provided with existing, larger geometry devices, thereby exacerbating the via filling difficulties described above. For example, unduly large voids can result in contact electrical resistance that is appreciably higher than desired. Moreover, high aspect ratio vias, (i.e., in excess of ~4:1) can be difficult to completely cleanse prior to filling, resulting in the accumulation of oxides at the junction with the underlying metal layer that can significantly increase via resistance. In addition, thinner regions of the metal layer adjacent to the via fill region will be subject to electromigration, which can result in the eventual opening of the circuits and failure of the device.

Current tungsten via processing begins with via opening by reactive ion etching (RIE) of an inter-level dielectric (ILD) deposited on appropriately patterned metal leads, such as TiN/Al-Cu/TiN multi-level leads. This is followed by deposition of a Ti/TiN adhesion layer/diffusion barrier, and finally deposition of the tungsten plug. Direct contact of the tungsten plug with the top or bottom aluminum lead can be detrimental to via resistance and electromigration reliability. One theory as to the cause of these problems is possible interaction of aluminum and tungsten, during which the imbalance between aluminum flux and tungsten flux promotes formation of Kirkendal voids. Therefore, it is required that the reactive ion etch not attack the TiN cap on aluminum leads, and that another TiN diffusion barrier be used before tungsten plug deposition to further isolate the aluminum from the tungsten. The drawback surrounding the use of a diffusion barrier in the via is that it blocks the diffusion (at an atomic level) of aluminum and copper from the top metal lead to the bottom metal lead. As a consequence, there arises a large flux divergence at the via bottom/Al-Cu interface, resulting in diminished electromigration performance.

Recent advancements in plug processing indicate that the tungsten plug can be replaced by an aluminum or copper plug deposited by either high temperature/high pressure sputtering or chemical vapor deposition (CVD). Due to their much lower resistance, the deposited aluminum or copper can be used simultaneously as both plugs in vias and conducting leads on the inter-level dielectric field. This eliminates the need of plug etch-back processing, thereby increasing product throughput and yield. There still remains, however, the problem of impurities and residue remaining at the bottom of the via following via/cavity formation that must be cleansed prior to filling in order to optimize electrical contact with the underlying metal layer. This residue usually is in the form of various oxides of titanium, TiNO, and oxides of aluminum. The residue is typically cleansed by sputter etch with gas ions of neutral elements (typically argon), or physical vapor deposition ("PVD") of elemental titanium which react with the residues to form a discontinuous layer of oxide that can yield regions of good electrical conductivity. Moreover, PVD of titanium requires the use of collimators for reduced geometry (i.e., sub-0.5 $\mu$m) structures. As geometries are scaled further down, lifespans for the collimators correspondingly decrease, necessitating more frequent collimator replacement and associated machine down-time (typically 6–8 hours/changeover) and productivity losses.

Physical vapor deposited titanium films are widely used, as liner layers for vias connecting stacked metal layers in integrated circuits. The high reactivity of titanium makes this material especially suited for liner application, as the titanium can aid in chemical reduction of oxides present on the metallic regions of the via. The increasing density of integrated circuits and associated reduction in the critical feature sizes of interconnections limits the applicability of standard physical vapor deposition/clean processes in the manufacture of ULSI circuits. Chemical vapor deposition and low power plasma clean processes are therefore necessary in order to continue the downward scaling trend of integrated circuits.

The limitation of physical vapor deposited titanium arises mainly due to the shadowing effects associated with this type of process. The large distribution of incidence angles of the sputtered species to the substrate causes preferential deposition on the openings of cavities such as contacts and vias, which limits the ability of the impinging species to reach the bottoms of these cavities. Thus, the step coverage of the sputtered film is reduced with reducing feature size and increasing feature height. The shadowing may be partially overcome by techniques such as "collimation", but these methods also cause a reduction in the deposition rate of the sputtered film, thereby prolonging wafer processing.

Chemical vapor deposition ("CVD") of titanium nitride is well documented in the literature, but the high reactivity of elemental titanium poses great difficulty for chemical vapor deposition of titanium. Moreover, the elevated process temperatures necessary for chemical vapor deposition of titanium are found to be incompatible with the comparatively low melting temperatures of the emerging low dielectric constant materials. In addition, the byproducts of such CVD processes are corrosive, which poses further difficulty to the manufacturability of such schemes.

Another widely used process, known as sputter deposition, achieves microscopic cleaning of surfaces by physical bombardment of inert gas atoms/ions. While this process aids in providing excellent electrical contact between adjacent conductive layers, topologically sharp features are also subject to preferential bombardment, leading to unwanted configurational changes of these features. Moreover, for high aspect ratio features, high ion energies are necessary in order to achieve sufficient bombardment at the bottom of the feature. A chemically aided cleaning process is therefore needed for achieving good contact characteristics between adjacent interconnect layers.

In view of the foregoing, it would be advantageous to provide a cleaning process and liner structure that did not disrupt process flows, which provided for effective cavity cleaning and the establishment of reliable surface connections, and which did not necessitate equipment downtime associated with costly and time consuming PVD maintenance and repairs. It would also be advantageous to provide an elemental titanium-free liner structure and cleaning process for sub-0.5 $\mu$m (micron) structures.

SUMMARY OF THE INVENTION

An elemental titanium-free liner and cavity cleansing process is provided that allows for the elimination of conventional sputter etch and elemental titanium depositions. A low power plasma etch provides for pre-conditioning/cleansing of cavities such as contacts and vias. A refractory metal is provided as a cavity liner. Preferably, the liner is comprised of several discrete refractory metal liner layers, each having a thickness of about 25–100 Å (Angstroms), that can be applied by CVD and/or PVD. A low power plasma cleanse is preferably interposed between each liner layer deposition. A suitable metal plug can be deposited and directed into the cavity to complete cavity filling. Preferably, the metal plug is an elemental aluminum or aluminum alloy plug that is deposited by CVD and force-filled into the cavity to reduce the incidence of micro-voids within the cavity.

The methods and apparatus of the invention allow for the elimination of both conventional sputter etch and elemental titanium depositions that are conventionally utilized in liner fabrication. Elimination of these aspects of the semiconductor fabrication process allows for a considerable reduction in the number of process steps, and therefore the amount of process time, associated with the formation and filling of intermetal connect layers. These reductions also significantly impact on reducing the "footprint" of the metallization cluster tool and also contribute to reducing the overall cost of the plug/interconnect process. Moreover, elimination of the conventional sputter etch and the high temperature processing (temp.$\geq$~400° C.) associated with such processing allows for the use of polymeric dielectrics; such as the family of polytetrafluoroethylene ("PTFE") compounds, which exhibit a dielectric constant ($\kappa$) of about 1.9; parylene ($\kappa$=~2.2–2.6); aerogels and xerogels ($\kappa$=~1.1–1.8); all of which are attractive because of their ability to reduce parasitic capacitance of the interconnects. Other suitable dielectric materials for use in the present invention include the family of polymeric spin-on-glass ("SOG") materials, such as the 1500 series manufactured by Allied Signal Corp.; polyimides; hydrogen silsesquioxane; and aerogels and surface modified aerogels such as fluorinated and methylated aerogels.

BRIEF DESCRIPTION OF THE DRAWINGS

These and other advantages and features of the invention will be apparent to those skilled in the art from a reading of the following description of the invention, taken together with the accompanying drawings in which feature dimensions and separation distances have been exaggerated for illustrative purposes, for which:

FIGS. 1A and 1B are cross-sectional illustrations of a via at initial and subsequent stages, respectively, of processing in accordance with the present invention;

FIG. 2 is a schematic illustration of a cluster tool for use in the practice of the present invention;

FIG. 3 is a cross-sectional view of a conventional structure at a latter stage of via filling;

FIG. 4 is a cross-sectional view of a via filled in accordance with the present invention.

DETAILED DESCRIPTION OF THE PREFERRED EMBODIMENTS

Figure 5:
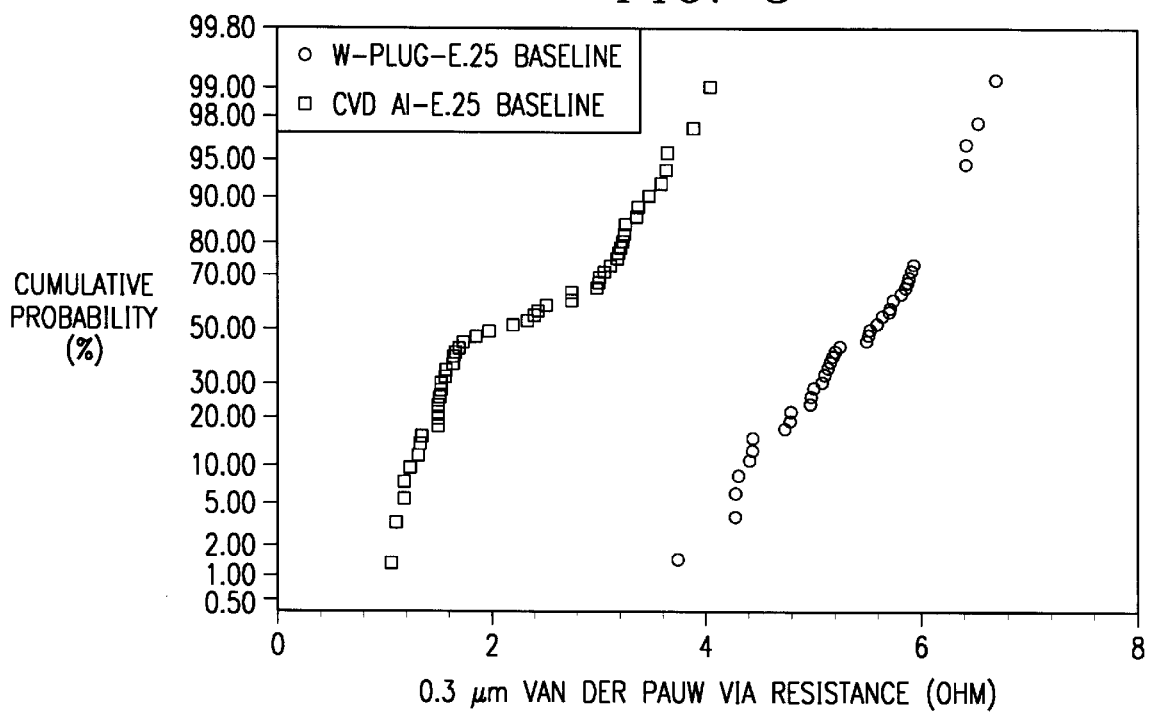
FIGS. 5 and 6 are graphs depicting reduced via resistance resulting from practice of the invention.

It is to be understood and appreciated that the process steps and structures described below do not form a complete process flow for the manufacture of integrated circuits. The present invention can be practiced in conjunction with integrated circuit fabrication techniques that are currently used in the art, and only so much of the commonly practiced process steps are included herein as are necessary to provide an understanding of the present invention. The drawing figures that are included with this specification and which represent cross-sections of portions of an integrated circuit during fabrication are not drawn to scale, but instead are drawn so as to illustrate the relevant features of the invention.

With reference to the drawings, wherein like referenced characters represent corresponding parts throughout the various views, and with particular reference to FIG. 1A, there is illustrated a portion of a semiconductor device, designated generally by referenced character 20, that is in the process of assembly. The illustrated device 20 at this stage of assembly is comprised of a substrate 22 that is typically formed of a semiconductive material such as silicon. Overlying the substrate 22 is a metal interconnect layer 24 that is typically formed of aluminum. As may be understood by persons of ordinary skill in the art, the metal interconnect layer 24 provides for electrical connection between different levels of an assembled device. A suitable dielectric material 26 is applied in overlying relation with the metal interconnect layer 24 and is patterned and etched in a manner well known in the art to define a cavity 28 such as a contact or via that provides for the electrical connection between metal interconnect layers 24 at different levels of the device. While FIG. 1A illustrates a single via 28 extending to a single metal interconnect layer 24 it is to be appreciated and understood that the invention described herein is likewise applicable to the formation of cavities or vias 28 which extend between different and/or multiple levels of the device so as to provide for electrical interconnection between selected levels of a device under assembly.

Semiconductor devices 20, such as that illustrated in FIG. 1A, can be processed in multi-station processing devices known as "clusters tools", such as those manufactured by Applied Materials, Inc. of San Jose, Calif. and Electrotech Ltd. of Bristol, U.K. A cluster tool, such as that designated by reference character 30 in FIG. 2, can be provided to fill metal interconnects such as cavities and vias 28 in accordance with the teachings of the present invention, as well as to fill such interlevel connects in accordance with conventional "prior art" practices. The illustrated cluster tool 30 is provided with a generally hexagonal "hub and spoke" configuration, and includes a cassette handler 32, that is operable to convey one or more semiconductor wafer cassettes (not shown) from a cassette loading station 34 to a pressure-variable loading dock 36. The loading dock 36 is operable to cycle between different levels of vacuum, as the cassettes are transported by the handler 32 between different process chambers, as will be described below.

The cassette handler 32 is configured as a rotatable, extensible arm that is operable to transfer wafers from thin cassettes to the process chambers and back to cassettes as the wafers undergo various types of processing within the cluster tool 30. A heating station 38 can be provided as one of the processing stations to implement preliminary thermal processing of the wafers.

In conventional device assembly practices, the metal interconnects/vias are filled in a multi-stage process that provides for an initial sputter etch to remove impurities 40 (FIG. 1A) from the cavity wall 42. Such impurities arise incident to the etch process that is used to form the cavities 28. The sputter etch can be performed at one of the processing stations, such as sputter etch station 44 depicted schematically in the cluster tool 30 of FIG. 2. The sputter etch is undertaken to provide for the physical bombardment with neutral gas ions (typically argon) which physically impinge upon and displace impurities 40 along the wall of the cavity 28. However, the etch process typically leaves various residues, such as $Ti_yO_x$, TiNO, and $Al_2O_3$, along the surface of the newly formed cavity. This residue must be cleansed from the cavity prior to further processing to avoid the formation of "open vias/contacts" that establish non-ohmic (high resistance) contacts.

Following pre-cleaning of the newly formed cavities 28, the wafers are typically transferred by handler 32 to a physical vapor deposition ("PVD") station 46 for the application of elemental titanium. Elemental titanium is extremely reactive, and will react with impurities/residue received within the cavity 28 to form discontinuous layers of oxide and allow for the establishment of conductivity readings therebetween. Following deposition of the elemental titanium, the handler 32 is operable to transfer the wafers from PVD station 46 (FIG. 2) to either a chemical vapor deposition ("CVD") station or a high temperature (i.e., Temp.$\geq$400° C.) sputter deposition station, jointly referenced by 48, for application of an appropriate via fill metal or plug 50 (FIG. 3). Operational status of the cluster tool can optionally be displayed on a system monitor 51. Typical fill materials include tungsten, aluminum and/or aluminum alloys, such as Al-Cu(0–2.0%). Recently, various force-fill techniques employing forcefill stations 52 (FIG. 2) have gained favor so as to reduce the incidence of voids 54 (FIG. 3) between the plug material 50 and the liner 47. As will be appreciated, reduction in the number and/or sizes in such voids 54 enhances electrical contact between the metal plug 50 and the liner 47, thereby facilitating electrical conduction through the filled cavity from an overlying metal interconnect layer (not shown) to an underlying metal interconnect layer 24. Following application of the plug 50, the device can be further processed in an appropriate manner, such as processing involving planarization, patterning, etching and the like.

Cavity fill in accordance with the teachings of the present invention is illustrated in FIGS. 1A and 1B. The sputter etch described above is replaced by a low power plasma etch, which can be implemented in a cluster tool 30, to provide for pre-conditioning/cleansing of previously formed cavities such as vias 28. The process of the present invention is particularly advantageous for use for high aspect ratio cavities, such as cavities having an aspect ratio in excess of 1.5, and particularly 4–5:1 or greater, whereby the aspect ratio is defined as a ratio between the cavity depth and width. In the operation of the invention, the cluster tool sputter etch station 44 is replaced with a plasma etch station and is operated at low power, typically $\leq$50–500 watts at a pressure of about 0.1–10 Torr. Optimal processing temperature is in a range of about 100°–450° C. for about 5–60 seconds. The plasma etch station 44 is operable to generate ions of argon, hydrogen, nitrogen and/or ammonia ($NH_3$) and can proceed at a voltage of up to about 400 V to direct the gas ions toward the device 20. Gas flows for each of the foregoing gases can be at a rate of up to about 500 sccm (standard cubic cm). In addition, the device 20 can be biased negative from about −300 to −400 V to attract the ions at high velocity for physical bombardment of the cavity wall 42.

Different gas or combinations of ions can be selected in accordance with the nature of the impurities and structural abnormalities included in the cavity/via 28. For example, nitrogen and argon, being heavier ions, would aid in physical bombardment of the substrate surfaces, as the ions would have comparatively greater momentum as opposed to lighter weight hydrogen ions. However, hydrogen can be advantageous due to its ability to chemically reduce thin oxide layers that may be present along metallic surfaces of the cavity/via 28. The use of nitrogen also permits for nitridation of metallic surfaces exposed in the bottom of the cavity/via. Moreover, metallic nitrides, (stoichiometric and non-stoichiometric) are conductive, and would therefore facilitate electrical connection through the filled cavity/via 28.

It is desirable in accordance with the present invention to deposit a refractory metal nitride or carbide liner to facilitate complete filling of the cavity/via 28. Such layers or liners 47 can include, by way of non-limiting example, TiN, TaN, WN, $Ti_xC_yN_z$ and $Ta_xC_yN_z$ (y, z=0.25 −0.5; x=1−(y+z)), as well as alloys of any of the foregoing materials. The liner layer 47 can be applied by physical vapor or chemical vapor deposition methods in appropriate clustering processing chambers, such as chambers 44 (plasma cleaning), 46 (PVD) and 48 (CVD). The liner that is ultimately provided along the cavity wall 42 is preferably comprised of one or more discrete liner layers 47a, each of which is applied to a thickness of ~25–100 Å. The deposition of each layer is separated by an intervening low power plasma treatment of the type described above. Preferably, the liner is comprised of 2–4 layers 47a (FIG. 1B), depending on such factors as the geometry of the device under manufacture, and the like. Each layer is deposited at a susceptor (i.e., wafer support surface (not shown)) temperature of about 300°–480° C. at a pressure of about 0.5–2.0 Torr. Nitrogen flow can be provided at a rate of about 40–200 sccm. TDMAT (He) flow can be provided at a rate of 40–100 sccm. The application of multiple liner layers 47a is indicated by the phantom line in FIG. 1B. As each liner layer 47a can be deposited in a period of about 6 sec., the impact of susceptor temperature on dielectric stability, even at the higher end of the above-referenced temperature range, is minimal.

The cavity fill metal or plug 50 (FIG. 4) can be in the form of an aluminum plug, such as an aluminum-copper alloy (having from 0–~2.0% Cu). Alternatively, tho plug 50 can be formed from tungsten followed by an appropriate etch-back, in a manner well known in the art. For application of an aluminum plug 50 by chemical vapor deposition, the processing parameters are as follows: temperature: 250°–270° C.; pressure: 20–30 Torr.; $H_2$ carrier flow: 250–350 sccm; Ar diluent: 0–300 sccm; and $H_2$ diluent: 0–300 sccm. The plug 50 is provided at a thickness from about 800–4,000 Å, in accordance with such factors as the aspect ratio of the cavity/via 28, overall geometry of the device under construction, and the like.

Wafer samples were processed to test the efficacy of the elemental titanium-free liner process of the present invention. Graphic data obtained from these test samples is provided at FIGS. 5 and 6. The test samples had the following features in common: silicon substrate (22); Al-Cu (0.5–2%) interconnect (24); HSQ dielectric (26); and 3,000 Å CVD aluminum plug (52). The cavities/via 28 featured an aspect ratio of 4:1. It is to be appreciated, however, that variations can be made to the foregoing recitation of materials and device features. For example, the metal connect layer 24 can be formed from a variety of appropriate aluminum alloys, Cu, Ta, Si and Ti, as well as alloys of the foregoing materials. In addition, different dielectric materials can be substituted for HSQ 26. For example, a polymeric dielectric such as parylene, as well as other dielectrics, such as aerogels, xerogels, and the like having advantageously low dielectric constants (κ) of less than about 3.0, can be substituted for HSQ. Patterning of the cavity/via 28 can be accomplished in a conventional manner, such as through the use of phase-shifted I-line lithography followed by conventional plasma etch.

Figure 6:
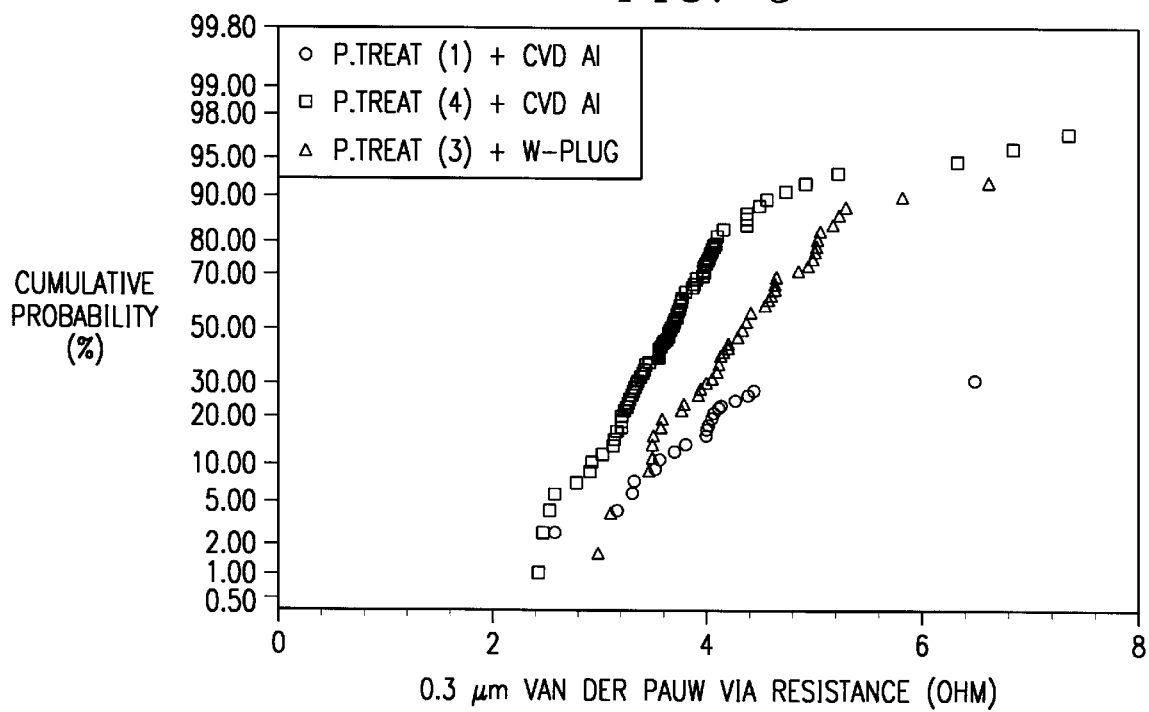

The advantages of the above-described elemental titanium-free liner structure and fabrication process are illustrated in FIGS. 5 and 6, which illustrate data obtained from 4:1 aspect ratio, 0.25 μm lots. It can be seen from the depicted graphs that the elemental titanium-free liner exhibits a resistance that is nearly half that of conventional tungsten plug technology as shown in FIG. 5. FIG. 6 illustrates the difference between aluminum-filled and tungsten-filled vias for elemental titanium-free via structures. For the two aluminum-filled structures, longer plasma treatment, indicated by square block graph "P. Treat (4)" exhibits a lower resistance than shorter-duration plasma treated contacts, denoted by circle graph "P. Treat (1)." Thus, the differences illustrated in this graph relate to differences between the use of: (a) tungsten versus aluminum plugs; and (b) the duration of plasma pre-treatment prior to cavity filling. The graphic data illustrated in FIG. 6 also illustrates the correlation between decreasing via resistance and increasing plasma treatment time.

Although the present invention and its advantages have been described in connection with the preferred embodiments, it should be understood that various changes, substitutions and alterations can be made herein without departing from the spirit and scope of the invention as defined by the accompanying claims. For example, dielectric layer 26 can include polymeric dielectrics, such as the family of polytetrafluorethylene ("PTFE") compounds, which exhibit a dielectric constant (κ) of about 1.9; parylene (κ=~2.2–2.6); aerogels and xerogels (κ=~1.1–1.8); all of which are attractive because of their ability to reduce parasitic capacitance of the interconnects. Other suitable dielectric materials for use in the present invention include the family of polymeric spin-on-glass ("SOG") materials, such as the 1500 series manufactured by Allied Signal Corp.; polyimides; hydrogen silsesquioxane; and aerogels and surface modified aerogels such as fluorinated and methylated aerogels, all of which are more fully described and incorporated herein by reference in one or more of the following copending patent applications: (1) Ser. No. 08/234,100 filed Apr. 28, 1994 and entitled "Self-Aligned Via Using Low Permittivity Dielectric"; (2) Ser. No. 08/286,761 filed Aug. 5, 1994 entitled "Porous Dielectric Layer with a Passivation Layer for Electronics Applications"; (3) Ser. No. 08/294,290 filed Aug. 23, 1994 entitled "Self-Aligned Contact Using Organic Dielectric Materials"; (4) Ser. No. 08/246,432 filed May 20, 1994 entitled "Interconnect Structure With An Integrated Low Density Dielectric"; and (5) Ser. No. 08/333, 015 filed Nov. 1, 1994 entitled "Pillars for Improved Damascene Conductor Fabrication". In general, dielectrics having a dielectic constant below about 2.5 are preferred. Further, while the foregoing discussion has provided for the use of a cluster tool for "sequential" or "in-situ" chamber-to-chamber processing within a single, multi-station machine, such is not required. Instead, the principles of the invention are equally applicable to ex-situ processing, whereby wafers are transferred from one machine to another, separate machine for subsequent processing in accordance with the processing regimen described above.

What is claimed is:

1. A method for depositing a liner in a cavity formed in a semiconductor device, comprising the steps of:

providing a semiconductor substrate;

forming a cavity in said substrate; and applying a refractory metal liner to said cavity, said liner comprising a plurality of discrete, titanium-free refractory metal liner layers applied to a thickness of up to about 100 Angstroms by at least one of a chemical vapor deposition and a physical vapor deposition process; and interposing a low power plasma cleanse of said cavity following deposition of said first liner layer.

2. The method according to claim 1, further comprising the step of depositing a fill metal in said cavity under positive pressure.

3. The method according to claim 1, wherein deposition of each of said liner layers is conducted at a temperature below about 400° C.

4. The method according to claim 1, wherein said substrate is comprised of a polymeric insulator.

5. The method according to claim 4, wherein said polymeric insulator comprises a dielectric having a dielectric constant below about 2.6.

6. The method according to claim 5, wherein said polymeric insulator is selected from the group consisting of polytetrafluoroethylene compounds, parylene, aerogels, xerogels and polymeric spin-on-glass materials.

\* \* \* \* \*